(12) United States Patent
Chou et al.

(10) Patent No.: US 9,800,259 B1
(45) Date of Patent: Oct. 24, 2017

(54) DIGITAL TO ANALOG CONVERTER FOR PERFORMING DIGITAL TO ANALOG CONVERSION WITH CURRENT SOURCE ARRAYS

(71) Applicant: Winbond Electronics Corp., Taichung (TW)

(72) Inventors: Fang-Ting Chou, Taichung (TW); Chung-Chih Hung, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/586,296

(22) Filed: May 4, 2017

(30) Foreign Application Priority Data

Jan. 20, 2017 (TW) .............................. 106102023 A

(51) Int. Cl.
*H03M 1/80* (2006.01)
*H03M 1/68* (2006.01)

(52) U.S. Cl.
CPC .................................. *H03M 1/687* (2013.01)

(58) Field of Classification Search
CPC .................................................... H03M 1/687
USPC .................................................. 341/144–153
See application file for complete search history.

(56) References Cited

U.S. PATENT DOCUMENTS 5,164,725 A * 11/1992 Long ................... H03M 1/0643
341/118
5,631,649 A    5/1997 Nakamura 7,276,885 B1 * 10/2007 Tagare .................... G05F 1/577
323/267
9,300,318 B1    3/2016 Medina Sanchez-Castro
2002/0011901 A1 * 1/2002 Dinh ..................... H03L 7/0895
331/17
2005/0140595 A1 * 6/2005 Yang ........................ G09G 3/30
345/76

(Continued)

FOREIGN PATENT DOCUMENTS

TW        478257        3/2002
TW      200540744      12/2005

(Continued)

OTHER PUBLICATIONS

"Office Action of Taiwan Counterpart Application," dated Jul. 17, 2017, pp. 1-4, in which the listed references were cited.

*Primary Examiner* — Lam T Mai
(74) *Attorney, Agent, or Firm* — JCIPRNET

(57) ABSTRACT

A digital to analog converter is provided, including a buffer circuit, a current switch circuit, and a weighted current generating circuit. The buffer circuit receives an N-bit digital signal and a clock signal, accordingly outputs N switch control signals. The current switch circuit includes N switches which are connected or disconnected according to the switch control signals. The weighted current generating circuit includes M current source arrays, where each current source array outputs K output currents. Current values of each output current of each current source array respectively ascend in a binary-weighted manner. A minimum output current of an mth current source array is two times of a maximum output current of a (m−1)th current source array, N is obtained by multiplying M by K, and $1 \leq m \leq M$. An output of the digital to analog converter is a total current value of the output currents outputted by the M current source arrays.

8 Claims, 5 Drawing Sheets

(56) References Cited

U.S. PATENT DOCUMENTS

| | | | | |
|---|---|---|---|---|
| 2005/0272397 | A1* | 12/2005 | Sowlati | H03D 7/1425 |
| | | | | 455/326 |
| 2009/0179783 | A1* | 7/2009 | Matumoto | G09G 3/3283 |
| | | | | 341/135 |
| 2011/0181453 | A1 | 7/2011 | Gaknoki | |
| 2012/0161997 | A1 | 6/2012 | Chou et al. | |
| 2015/0263743 | A1* | 9/2015 | Nakanishi | H03M 1/662 |
| | | | | 341/150 |

FOREIGN PATENT DOCUMENTS

| | | |
|---|---|---|
| TW | 200607327 | 2/2006 |
| TW | 200803184 | 1/2008 |
| TW | I307222 | 3/2009 |
| TW | I531170 | 4/2016 |

* cited by examiner

DIGITAL TO ANALOG CONVERTER FOR PERFORMING DIGITAL TO ANALOG CONVERSION WITH CURRENT SOURCE ARRAYS

CROSS-REFERENCE TO RELATED APPLICATION

This application claims the priority benefit of Taiwan application serial no. 106102023, filed on Jan. 20, 2017. The entirety of the above-mentioned patent application is hereby incorporated by reference herein and made a part of this specification.

BACKGROUND OF THE INVENTION

1. Field of the Invention

The present invention relates a technology of digital to analog conversion, and in particular to a current digital to analog converter.

2. Description of Related Art

An existing digital to analog converter (DAC) is widely applied to data conversion of an electronic device, mainly for converting a digital signal into a corresponding analog signal and providing the analog signal to the electronic device to perform a relevant application. A current DAC is a common high-speed DAC today. Because the current DAC may directly drive a load without requiring an additional amplifier to serve as an assist, the current DAC is one of the optimum architectures commonly used by a high-resolution and high-speed DAC.

Today, performance indicators of the DAC may have aspects of static and dynamic. An aspect of static features mainly relates to Integral nonlinearity error (INL) and Differential nonlinearity error (DNL). Values of the two indicators are determined by matching of a current source. A greater converted bit often requires more unit current source transistors, and occupies a greater area, so as to achieve a better INL and DNL. Therefore, a general N-bit DAC needs $2^N$ unit current source transistors in total, so that an area of an overall current source is increased as the bit increases.

In addition, in an aspect of dynamic features, main performance indicators are Spurious Free Dynamic Range (SFDR) and a speed. The INL and the SFDR are related to the output impedance of the unit current source transistors. When the bit is greater, the number of the current source transistors is greater and the output impedance of the required unit current source transistors is greater, and thus cannot be applied to a system of a low supply voltage.

SUMMARY OF THE INVENTION

On this basis, the present invention provides a current digital to analog converter (current DAC) which may replaces a single reference current source in a traditional design by using architecture of a plurality of reference current sources, so as to implement a current DAC of a low power, a small area, and low output impedance.

The DAC of the present invention is applied to performing a digital to analog conversion to an N-bit digital signal, where N is a composite number. The DAC includes: a buffer circuit, a current switch circuit, and a weighted current generating circuit. The buffer circuit receives a digital signal and a clock signal, and responds, using the clock signal as a time reference, to the digital signal to output N switch control signals. The current switch circuit includes N switches, where each of the switches is connected or disconnected according the corresponding switch control signal. The weighted current generating circuit includes M current source arrays, where each current source array outputs K output currents. Current values of each output current of each current source array respectively ascend in a binary-weighted manner. Moreover, a minimum output current of an mth current source array is two times of a maximum output current of a (m−1)th current source array. N is obtained by multiplying M by K, M, K, and m are positive integers greater than 1, and $1<m \leq M$. An output of the DAC is a total current value of the output currents of the M current source arrays outputted through the N switches.

In view of the above, the DAC of the present invention may divides a single current source array in a traditional design into a plurality of individual ones, and separately generate, using a plurality of reference current sources, a plurality of individual reference currents to be provided to the corresponding current source array. On this basis, the number and an area of current source transistors required by each current source array may be reduced. At the same time, output impedance of a unit current source transistor may also be decreased, so as to implement a DAC of a low power and better performances.

In order to make the aforementioned objectives and advantages of the present invention comprehensible, embodiments accompanied with figures are described in detail below.

DESCRIPTION OF THE EMBODIMENTS

Figure 1:
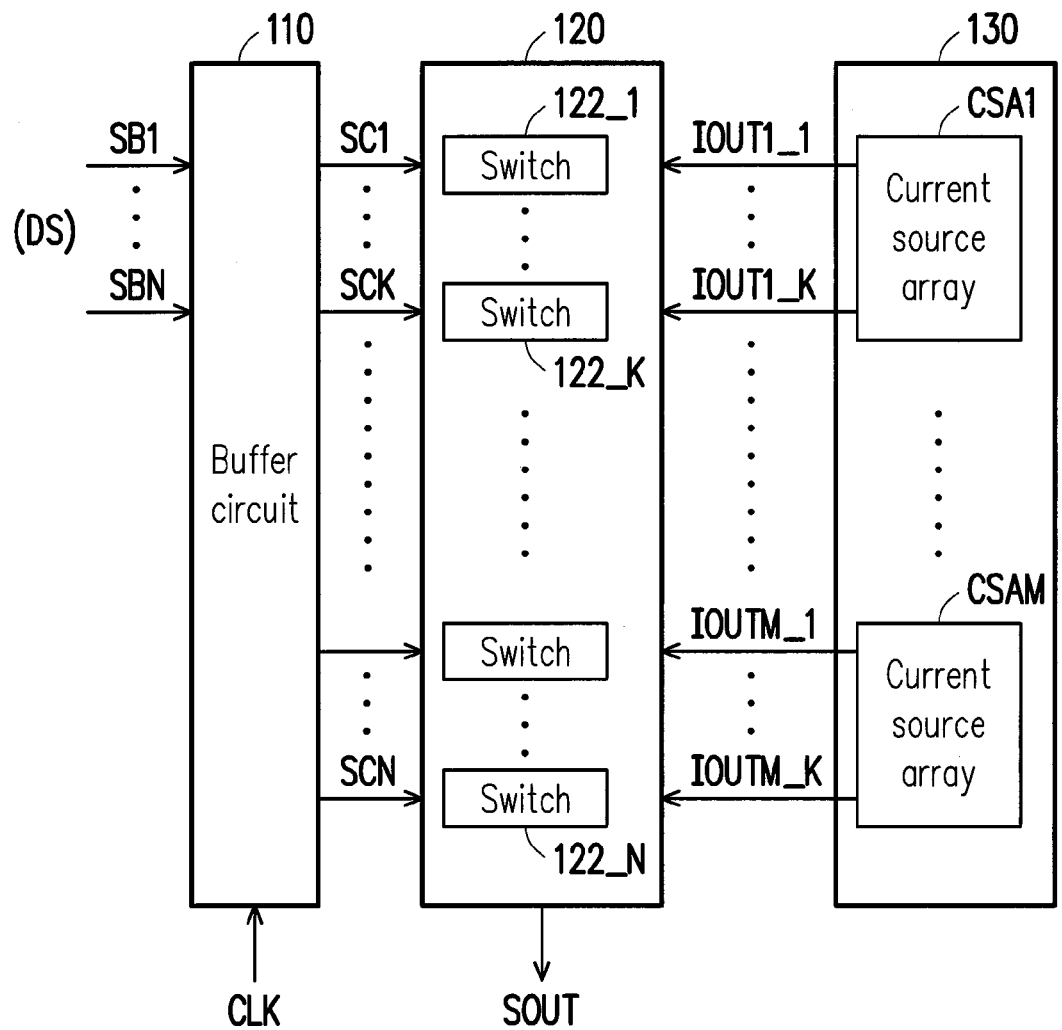
FIG. 1 is a schematic diagram of a digital to analog converter according to an embodiment of the present invention.

First, referring to FIG. 1, in the present embodiment, a DAC 100 includes a buffer circuit 110, a current switch circuit 120, and a weighted current generating circuit 130. The DAC 100 of the present embodiment is applied to performing a digital to analog conversion to an N-bit digital signal DS. The digital signal DS may be constituted of single-digit bit signals SB1-SBN. Regarding a design, the DAC 100 may equally divide current source arrays into multiple according to the digit of the processed digital signal DS to perform a digital to analog conversion processing, where N needs to be a composite number. Refer to the following for detailed description about equally dividing the current source arrays.

The buffer circuit 110 receives the digital signal DS and a clock signal CLK, and responds, using the clock signal CLK as a time reference, to the digital signal DS to output N switch control signals SC1-SCN. For example, the buffer circuit 110 may include, for example, an input buffer and a latch, and synchronously output the N switch control signals SC1-SCN according to the N-bit digital signal DS in cooperation with the clock signal CLK.

The current switch circuit 120 is coupled to the buffer circuit 110. The current switch circuit 120 includes N switches 122_1-122_N, where each of the switches 122_1-122_N is connected or disconnected according the corresponding switch control signals SC1-SCN. For example, when a switch control signal is a low logic level (first logic level), a switch controlled thereby is disconnected; and when the switch control signal is a high logic level (second logic level), a switch controlled thereby is connected The weighted current generating circuit 130 is coupled to the current switch circuit 120. The weighted current generating circuit 130 includes M current source arrays CSA1-CSAM, where each of the current source arrays CSA1-CSAM may output K output currents. For example, a current source arrays CSA1 outputs K output currents IOUT1_1-IOUT1_K. Moreover, N is obtained by multiplying M by K; and M and K are positive integers greater than 1.

In addition, current values of each output current of the current source arrays CSA1-CSAM respectively ascend in a binary-weighted manner. Moreover, a minimum output current of an mth current source array is two times of a maximum output current of a (m−1)th current source array. m is a positive integer greater than 1, and $1<m\leq M$. For example, Table 1 below describes output current values of current source arrays CSA1-CSA3 in a case in which N is 12, M is 3, and K is 4.

| Current source array | Output current value |
|---|---|
| CSA1 | $IOUT1\_1=2^0 IREF1$ |
| | $IOUT1\_2=2^1 IREF1$ |
| | $IOUT1\_3=2^2 IREF1$ |
| | $IOUT1\_4=2^3 IREF1$ |
| CSA2 | $IOUT2\_1=2^4 IREF1$ |
| | $IOUT2\_2=2^5 IREF1$ |
| | $IOUT2\_3=2^6 IREF1$ |
| | $IOUT2\_4=2^7 IREF1$ |
| CSA3 | $IOUT3\_1=2^8 IREF1$ |
| | $IOUT3\_2=2^9 IREF1$ |
| | $IOUT3\_3=2^{10} IREF1$ |
| | $IOUT3\_4=2^{11} IREF1$ |

In can be known from Table 1 that, in an embodiment of the present invention, current values of output currents IOUT1_1-IOUT1_4 of the current source array CSA1 respectively ascend in a binary-weighted manner. IREF1 is a reference current used by the current source array CSA1. In addition, a minimum output current IOUT2_1 of the second current source array CSA2 is two times of a maximum output current IOUT1_4 of the first current source array CSA1; and a minimum output current IOUT3_1 of the third current source array CSA3 is two times of a maximum output current IOUT2_4 of the second current source array CSA2. Output currents IOUT2_1-IOUT2_4 of the second current source array CSA2 may be considered to ascend in a binary-weighted manner using $2^4 IREF1$ as a reference, and a reference current IREF2 used by the current source array CSA2 may be equal to the $2^4 IREF1$.

An output SOUT of the DAC 100 is a total current value of the output currents of the M current source arrays CSA1-CSAM outputted through the N switches. According to the foregoing circuit structure, the DAC 100 may control the connection or disconnection of each of the switches 122_1-122_N according to a logic level of the digital signal DS (bit signals SB1-SBN), thereby converging the corresponding output currents into the output SOUT of the total current value according to connected switches. The output SOUT may be, for example, provided to an output load (such as a resistor), so as to generate a converted analog signal, thereby completing the digital to analog conversion.

In order to describe circuit structures and operation manners of the current switch circuit 120 and the weighted current generating circuit 130 in the DAC 100 further in detail, the following is described with reference to FIG. 2.

Figure 2:
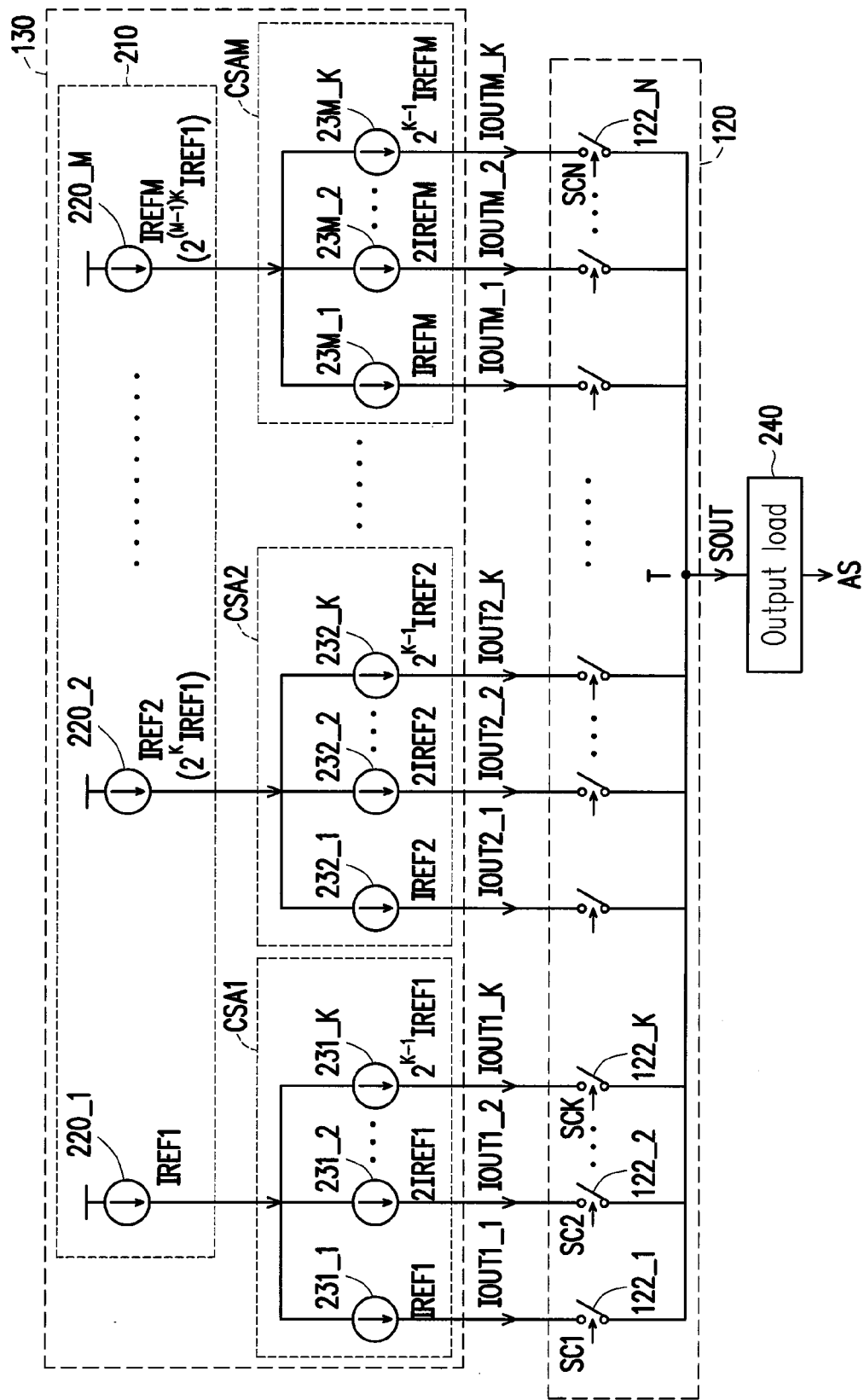
FIG. 2 is a schematic diagram of a current switch circuit and a weighted current generating circuit according to an embodiment of the present invention.

As shown in FIG. 2, the weighted current generating circuit 130 may further include a reference current generating unit 210. The reference current generating unit 210 is coupled to the M current source arrays CSA1-CSAM, separately. The reference current generating unit 210 includes M reference current sources 220_1-220_M. Each of the reference current source 220_1-220_M is responsible for generating different reference currents to the corresponding current source arrays. Specifically, as shown in FIG. 2, the reference current source 220_1 may generate a reference current IREF1 and provide the same to the corresponding current source array CSA1. On this basis, output current values of output currents IOUT1_1-IOUT1_K of the current source array CSA1 as stated above may be set as IREF1, 2IREF1 ... $2^{K-1}$IREF1 ascending in a binary-weighted manner, respectively (being equivalent to be represented as current source 231_1-231_K in FIG. 2).

In addition, the reference current source 220_2 may generate the reference current IREF2 and provide the same to the corresponding current source array CSA2.

It can be known from the above that the minimum output current IOUT2_1 of the current source array CSA2 is two times of a maximum output current IOUT1_K of the current source array CSA1. Because a current value of the output current IOUT1_K is $2^{K-1}$IREF1, a current value of the output current IOUT2_1 should be $2^K$IREF1. Therefore, a current value of the reference current IREF2 provided by the reference current source 220_2 should be $2^K$IREF1. Similarly, a reference current generated by an mth reference current source to the mth current source array is $K^{th}$ power of 2 times of a reference current generated by a (m−1)th reference current source to the (m−1)th current source array. A reference current IREFM provided by a reference current source 220M should be $2^{(M-1)K}$IREF1.

In addition, as shown in FIG. 2, each of the current source arrays CSA1-CSAM includes K output ends. First end of each of the switches 122_1-122_N in the current switch circuit 120 is coupled to a corresponding output end in the output end of each of the current source arrays CSA1-CSAM, and second end of each of the switches 122_1-122_N is coupled to an output node T. Each of the switches 122_1-122_N is controlled by corresponding switch control signals SC1-SCN, so as to output corresponding output currents through each of the switches 122_1-122_N to be converged to the output node T, and output the total current value (output SOUT) by the output node T. In FIG. 2, the output node T is coupled to an output load 240, so as to be able to generate a converted analog signal AS through the output load 240, thereby completing the digital to analog conversion.

Figure 3:
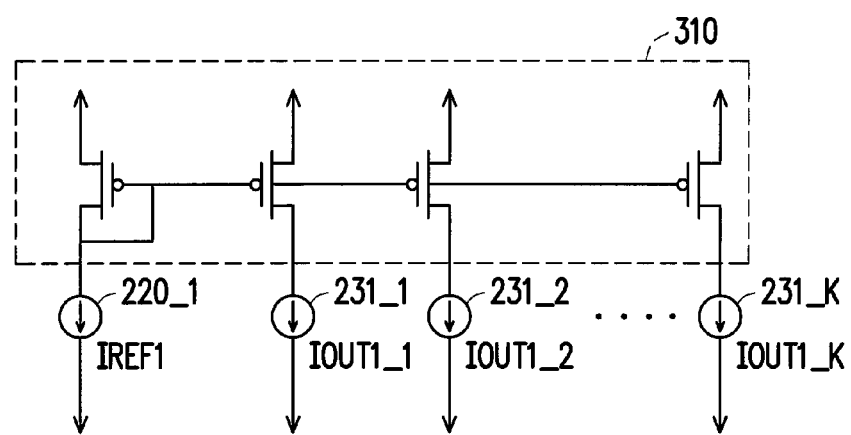
FIG. 3 is a schematic diagram of a weighted current mirror array according to an embodiment of the present invention.

In an embodiment of the present invention, each of the current source arrays may include a weighted current mirror array. As shown in FIG. 3, a weighted current mirror array 310 is coupled to the corresponding reference current source 220_1 in the M reference current sources 220_1-220_M. Moreover, the weighted current mirror array 310 may generate the K output currents IOUT1_1-IOUT1_K in a manner of ascending mirror ratios in the binary-weighted manner. In the present embodiment, the "mirror ratio", for example, refers to a ratio of the number of master/slave unit current source transistors which are configured to compose a current mirror with regard to the reference current source 220_1 and the current sources 231_1-231_K. Generally, if a width/length ratio of a resistor of the current mirror is implemented to be the same, according to the ratio of the master/slave unit current source transistors, a slave side current may be provided by using a master side current of the current mirror as a reference. For example, in the present embodiment, the reference current IREF1 provided by the reference current source 220_1 is the master side current of the current mirror. Moreover, by adjusting a mirror ratio between the master side and the slave side, outputs of the current sources 231_1-231_K may be determined to be taken as the output currents IOUT1_1-IOUT1_K of the slave side current.

Further, the DAC 100 of the present invention separately generates a plurality of individual reference currents IREF1-IREFM by using the plurality of reference current sources 220_1-220_M and provides the reference currents IREF1-IREFM to the corresponding current source arrays CSA1-CSAM. Therefore, maximum output currents outputted by the current source arrays CSA1-CSAM are all formed by mirroring based on the reference currents at different binary-weighted degrees which are received by the current source arrays. Compared with forming all reference currents by using a single reference current source, a minimum reference current is not needed to be used as the reference to mirror. In this way, a maximum mirror ratio required by the weighted current mirror array may be significantly reduced, and the number, area, and output impedance of the unit current source transistors may further be decreased.

Back to FIG. 2, the reference current IREF2 provided by the reference current source 220_2 is $K^{th}$ power of 2 times of the reference current IREF1 provided by the reference current source 220_1. Structures of the reference current source 220_1 and the reference current source 220_2 are described below with examples.

Figure 4:
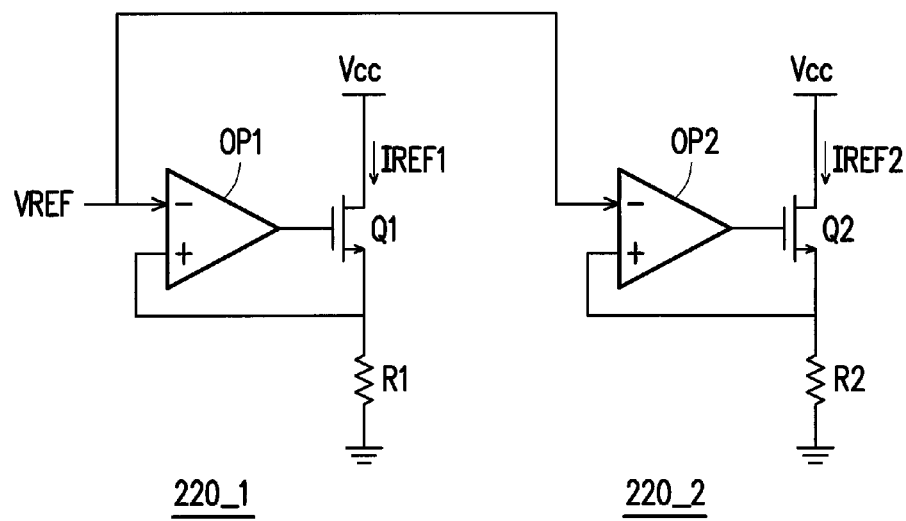
FIG. 4 is a schematic diagram of a reference current source according to an embodiment of the present invention.

Referring to FIG. 4, the reference current source 220_1 includes an N-typed field effect transistor Q1, a resistor R1, and an operational amplifier OP1. A drain electrode of the N-typed field effect transistor Q1 is coupled to a supply voltage Vcc, and provides the reference current IREF1.

A first end of the resistor R1 is coupled to a source electrode of the field effect transistor Q1, and a second end of the resistor R1 is coupled to a ground potential. A non-inverting input of the operational amplifier OP1 is coupled to the source electrode of the N-typed field effect transistor Q1; and an inverting input of the operational amplifier OP1 receives a reference voltage VREF and is coupled to an inverting input of an operational amplifier OP2 in the other reference current source 220_2. The reference current source 220_2 includes an N-typed field effect transistor Q2, a resistor R2, and an operational amplifier OP2, and has a structure similar to that of the reference current source 220_1.

A resistance of the resistor R2 of the second reference current source 220_2 is $K^{th}$ power of 2 times of a resistance of the resistor R1 of the first reference current source 220_1. On this basis, the reference current IREF2 provided by the reference current source 220_2 may be $K^{th}$ power of 2 times of the reference current IREF1 provided by the reference current source 220_1.

It should be noted that, in an embodiment, a decoding circuit may also be provided in the DAC to decode some bit signals in the digital signal, so as to generate the switch control signals.

Figure 5:
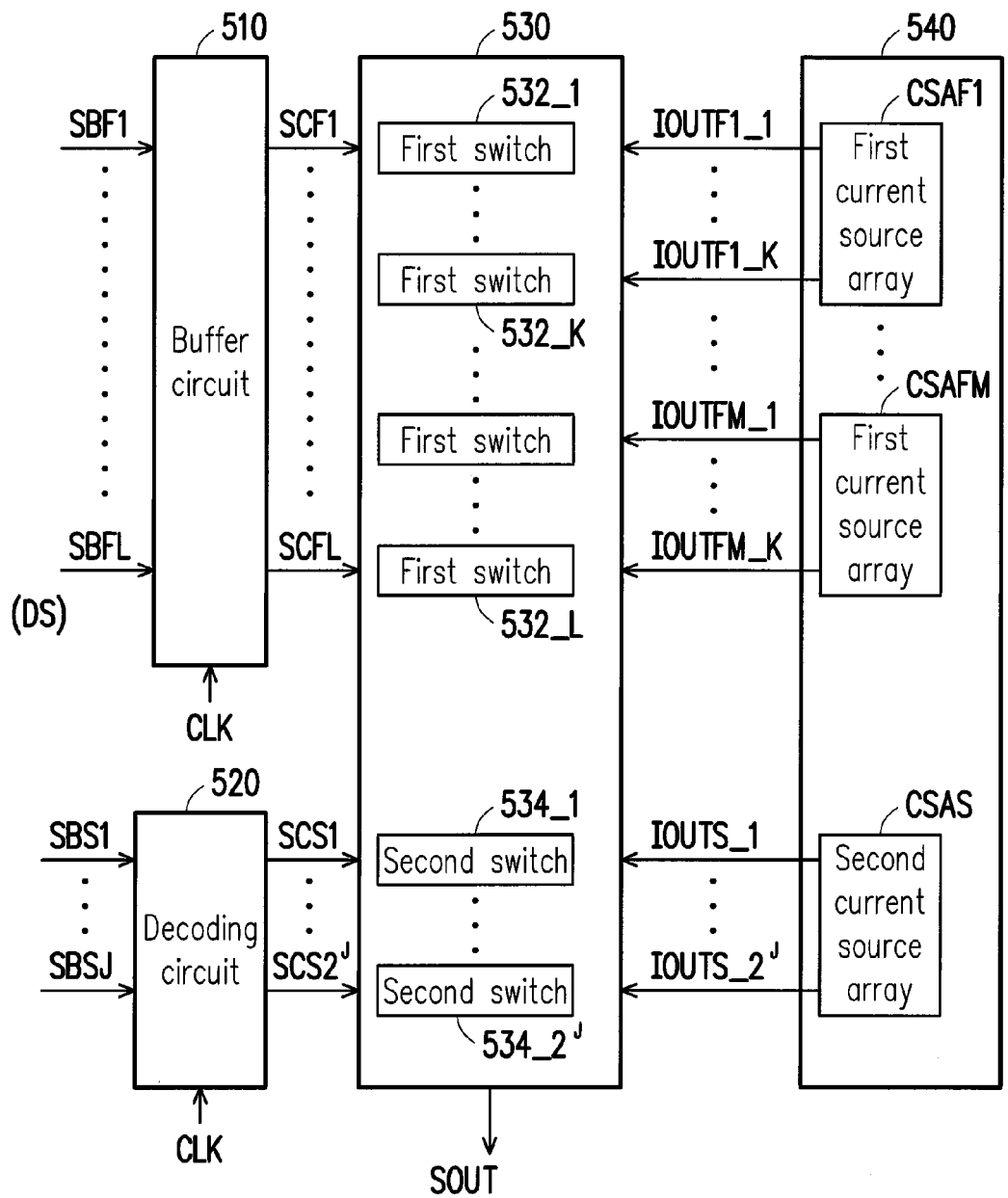
FIG. 5 is a schematic diagram of a digital to analog converter according to another embodiment of the present invention.

As shown in FIG. 5, in the present embodiment, a DAC 500 includes a buffer circuit 510, a decoding circuit 520, a current switch circuit 530, and a current generating circuit 540. The DAC 500 is applied to performing a digital to analog conversion to an N-bit digital signal DS. In an embodiment of the present invention, the digital signal DS includes a first signal of L bits and a second signal of J bits (N=L+J). As shown in FIG. 5, the first signal may be composed of single-digit bit signals SBF1-SBFL, and the second signal may be composed of single-digit bit signals SBS1-SBSJ. Moreover, L needs to be a composite number.

The buffer circuit 510 receives the first signal (the bit signals SBF1-SBFL) and a clock signal CLK, and responds, using the clock signal CLK as a time reference, to the bit signals SBF1-SBFL to output L first switch control signals SCF1-SCFL. For example, the buffer circuit 510 may include, for example, an input buffer and a latch, and synchronously output the L first switch control signals SCF1-SCFL according to the bit signals SBF1-SBFL in cooperation with the clock signal CLK.

The decoding circuit 520 receives the second signal (the bit signals SBS1-SBSJ) and the clock signal CLK, and decodes, using the clock signal CLK as the time reference, the bit signals SBS1-SBSJ to output $J^{th}$ power of 2 times of second switch control signals SCS1-SCS$2^J$.

The current switch circuit 530 is coupled to the buffer circuit 510 and the decoding circuit 520. The current switch circuit 530 includes L first switches 532_1-532_L and $P^{th}$ power of 2 times of second switches 534_1-534_$2^J$. The first switches 532_1-532_L are connected or disconnected according to the corresponding first switch control signals SCF1-SCFL, and the second switches 534_1-534_$2^J$ are connected or disconnected according to the corresponding second switch control signals SCS1-SCS$2^J$.

The current generating circuit 540 is coupled to the current switch circuit 530. The current generating circuit 540 includes M first current source arrays CSAF1-CSAFM and a second current source array CSAS, where each of the first current source arrays CSAF1-CSAFM may output K output currents. L is obtained by multiplying M by K; and M and K are positive integers greater than 1. That is, M and K are factors of L greater than 1.

In addition, current values of each output current of the first current source arrays CSAF1-CSAFM respectively ascend in a binary-weighted manner. Moreover, a minimum output current of an mth first current source array is two times of a maximum output current of a (m−1)th first current source array, where m is a positive integer greater than 1, and 1<m≤M. Herein, operation manners of the first current source arrays CSAF1-CSAFM are same or similar to those of the current source arrays CSA1-CSAM in the foregoing embodiments. Therefore, details are not provided herein again.

The second current source array CSAS outputs $J^{th}$ power of 2 of output currents TOUTS_1-IOUTS_$2^J$, where J is also a positive integer greater than 1.

Current values of each output current of the second current source array CSAS is the same and all are a half of a minimum output current of a first first current source array (the first current source arrays CSAF1), or is two times of a maximum output current of an Mth first current source arrays (the first current source arrays CSAFM). Specifically, when the first signal (the bit signals SBF1-SBFL) is at an upper-bit portion of the digital signal DS and the second signal (the bit signals SBS1-SBSJ) is at a lower-bit portion of the digital signal DS, each output current value of the second current source array CSAS is a half of a minimum output current the first current source array CSAF1. On the contrary, when the first signal (the bit signals SBF1-SBFL) is at a lower-bit portion of the digital signal DS and the second signal (the bit signals SBS1-SBSJ) is at an upper-bit portion of the digital signal DS, each output current value of the second current source array CSAS is two times of a maximum output current the first current source array CSAFM.

An output SOUT of the DAC 500 is a total current value of the output currents of the M first current source arrays CSAF1-CSAFM and the second current source array SCAS outputted through the L first switches 532_1-532_L and the $J^{th}$ power of 2 times of second switches 534_1-534_$2^J$. According to the foregoing circuit structure, the DAC 500 may control the connection or disconnection of each of the switches according to a logic level of the digital signal DS (including bit signals SBF1-SBFL and SBS1-SBSJ), thereby converging the corresponding output currents into the output SOUT of the total current value through the connected switches. The output SOUT may be, for example, provided to an output load (such as a resistor), so as to generate a converted analog signal, thereby completing the digital to analog conversion.

In view of the above, the DAC of the present invention may separately generate, using a plurality of reference current sources, a plurality of individual reference currents to be provided to the corresponding individual current source arrays. On this basis, by dividing a single traditional current source array into a plurality of smaller individual ones, the number and area of unit current source transistors required by each current source array may be reduced. At the same time, output impedance of a unit current source transistor may also be decreased, so as to improve the INL and reduce the SFDR, thereby implementing a DAC of a low power and better performances.

What is claimed is:

1. A digital to analog converter, applied to performing a digital to analog conversion to an N-bit digital signal, wherein N is a composite number, and the digital to analog converter comprises:
   a buffer circuit, receiving the digital signal and a clock signal, and responding, using the clock signal as a time reference, to the digital signal to output N switch control signals;
   a current switch circuit, coupled to the buffer circuit and comprising N switches, each switch being connected or disconnected according the corresponding switch control signal;
   a weighted current generating circuit, coupled to the current switch circuit, and comprising M current source arrays, wherein each current source array outputs K output currents, current values of each output current of each current source array respectively ascend in a binary-weighted manner, a minimum output current of an mth current source array is two times of a maximum output current of a (m−1)th current source array, N is obtained by multiplying M by K, M, K, and m are positive integers greater than 1, and 1<m≤M, and
   an output of the digital to analog converter is a total current value of the output currents of the M current source arrays outputted through the N switches.

2. The digital to analog converter according to claim 1, wherein the weighted current generating circuit further comprises:
   a reference current generating unit, coupled to the M current source arrays separately, and comprising M reference current sources, wherein each reference current source is configured to generate a reference current to the corresponding current source array, and the reference current generated to the mth current source array is $K^{th}$ power of 2 times of the reference current generated to the (m−1)th current source array.

3. The digital to analog converter according to claim 2, wherein each current source array comprises:
   a weighted current mirror array, coupled to a corresponding reference current source of the M reference current sources, and generating the K output currents in a manner of ascending mirror ratios in the binary-weighted manner.

4. The digital to analog converter according to claim 2, wherein each reference current source comprises:
   an N-typed field effect transistor, a drain electrode thereof being coupled to a supply voltage, and the reference current being provided by the drain electrode thereof;
   a resistor, a first end thereof being coupled to a source electrode of the N-typed field effect transistor, and a second end thereof being coupled to a ground potential; and
   an operational amplifier, a non-inverting input thereof being coupled to the source electrode of the N-typed field effect transistor, and an inverting input thereof receiving a reference voltage and being coupled to an inverting input of an operational amplifier in other reference current sources,
   wherein, a resistance of the resistor of a (m−1)th reference current source is $K^{th}$ power of 2 times of a resistance of the resistor of an mth reference current source.

5. The digital to analog converter according to claim 2, wherein each current source array comprises K output ends, a first end of each switch is coupled to a corresponding output end in the output ends, and a second end of the each switch is coupled to an output node.

6. The digital to analog converter according to claim 4, wherein when a switch control signal is a first logic level, a switch controlled by the switch control signal is disconnected; and when the switch control signal is a second logic level, a switch controlled by the switch control signal is connected, in this way, the corresponding output current is outputted to the output node by using each switch, and the total current value is outputted through the output node.

7. The digital to analog converter according to claim 5, wherein the output node is coupled to an output load, and generates a converted analog signal through the output load.

8. A digital to analog converter, applied to performing a digital to analog conversion to an N-bit digital signal, wherein the digital signal comprises a first signal of L bits and a second signal of J bits, N=L+J, L is a composite number, and the digital to analog converter comprises:
   a buffer circuit, receiving the first signal and a clock signal, and responding, using the clock signal as a time reference, to the first signal to output L first switch control signals;
   a decoding circuit, receiving the second signal and the clock signal, and decoding, using the clock signal as the time reference, the second signal to output $J^{th}$ power of 2 times of second switch control signals;
   a current switch circuit, coupled to the buffer circuit and the decoding circuit, and comprising L first switches and $J^{th}$ power of 2 times of second switches, wherein each first switch is connected or disconnected according to the corresponding first switch control signal, and each second switch is connected or disconnected according to the corresponding second switch control signal; and a current generating circuit, coupled to the current switch circuit, and comprising M first current source arrays and a second current source array, wherein each first current source arrays outputs K output currents, current values of each output current of each first current source arrays respectively ascend in a binary-weighted manner, a minimum output current of an mth first current source array is two times of a maximum output current of a (m−1)th first current source array, L is obtained by multiplying M by K, J, M, K, and m are positive integers greater than 1, 1<m≤M, the second current source array outputs $J^{th}$ power of 2 times of output currents, current values of each output current of the second current source array are the same and are a half of a minimum output current of a first first current source array, or are two times of a maximum output current of an Mth first current source arrays, wherein, an output of the digital to analog converter is a total current value of the M first current source arrays and the second current source array through the L first switches and the $J^{th}$ power of 2 times of second switches.

* * * * *